United States Patent [19]

Abe et al.

[11] Patent Number: 5,037,309

[45] Date of Patent: Aug. 6, 1991

[54] HOLDER FOR INSTALLING PARTS ON PRINTED CIRCUIT BOARD

[75] Inventors: Youji Abe, Kiyose; Takehiko Togashi, Hachiouji, both of Japan

[73] Assignee: TEAC Corporation, Japan

[21] Appl. No.: 535,894

[22] Filed: Jun. 11, 1990

[30] Foreign Application Priority Data

Jun. 13, 1989 [JP] Japan ................................. 1-68755

[51] Int. Cl.⁵ ............................................. H01R 9/09
[52] U.S. Cl. ........................................ 439/56; 29/832; 362/368; 439/59
[58] Field of Search ................... 439/56, 59; 362/368, 362/369, 457; 29/832, 834

[56] References Cited

U.S. PATENT DOCUMENTS 4,717,218 1/1988 Ratcliff ................................. 439/59

OTHER PUBLICATIONS

"Circuit Board Mounting and Lamp Housing"; Knappenberger et al.; IBM Tech. Dis. Bull., vol. 22, No. 4; Sep. 1979.

Primary Examiner—Carl E. Hall
Attorney, Agent, or Firm—Andrus, Sceales, Starke & Sawall

[57] ABSTRACT

A holder which is used for installing a part such as a light emitting diode on a printed circuit board, the printed circuit board having a connecting section and a pair of conduction terminals, the connecting section serving to mechanically connect the holder to the printed circuit board, the conduction terminals serving to electrically connect a pair of terminals of the part to the printed circuit board. The holder includes a fitting portion in which the part is inserted, a fixing portion extending from a lower rear position of the fitting portion, and a pressure portion extending rearward from the fitting portion. The fitting portion serves to locate the terminals of the part on the conduction terminals of the printed circuit board, the fixing portion acts to mechanically connect the printed circuit board, and the pressure portion brings the terminals of the part on the conduction terminals of the printed circuit board under pressure due to an elastic deformation of the pressure portion when the part is installed into the fitting portion, allowing electrical connection between the part and the printed circuit board.

8 Claims, 3 Drawing Sheets

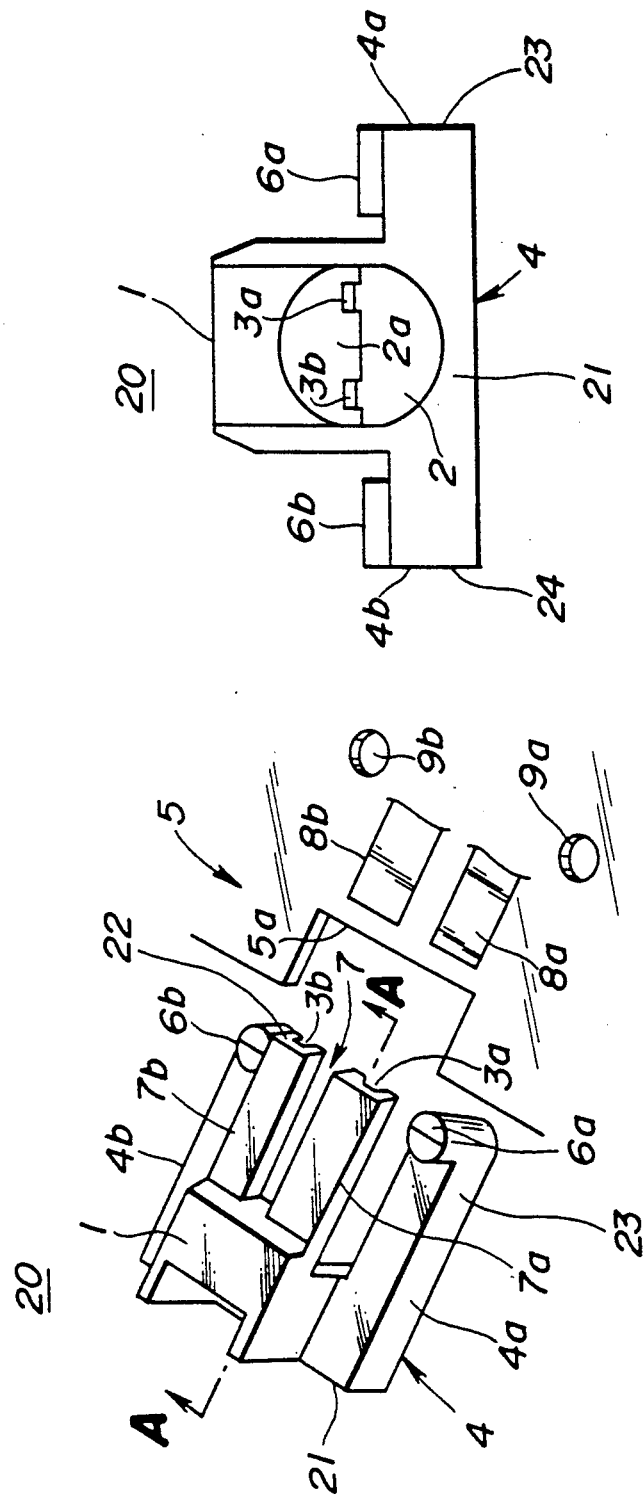

HOLDER FOR INSTALLING PARTS ON PRINTED CIRCUIT BOARD

BACKGROUND OF THE INVENTION

The present invention relates generally to part installing holders, and more particularly to a part installing holder for installing a part on a printed circuit board to make an electrical connection between the part and the printed circuit board and for removing the part from the printed circuit board.

Generally, several types of electronic parts are packaged into a printed circuit board (hereinafter referred to as a PC board), the electronic parts being electrically connected to the PC board by soldering them directly or indirectly to the PC board. For example, for an indicating lamp, one method for installing the indicating lamp on the PC board is to install the indicating lamp directly on a display panel and then electrically connect the display panel to the PC board via a connecting wire. Another method for installing the indicating lamp is to solder the indicating lamp directly to the PC board and install the PC board on the display panel. And, still another method for installing a part on the PC board is to solder a socket to the PC board to make an electrical connection between them so that the part can be installed on and removed from the socket.

However, the need to replace an existing electronic part with a new part for specification changes or maintenance purposes occasionally arises after the existing electronic part is installed on the PC board. And in some cases, a demand for a parts exchange regarding the PC board occurs, for example, to change a color specification of an indicating lamp. If the part is soldered to the PC board, it is difficult to remove the part from the PC board without putting an additional burden on the manufacturer who usually supplies finished products on a streamlined basis. Removal of the part from the PC board requires first removing the solder, which often results in a loss of time and assembly line labor. The use of the socket facilitates parts exchange work, but there is still a problem in view of the cost of manufacturing products.

SUMMARY OF THE INVENTION

Accordingly, it is a general object of the present invention to provide a novel and useful part installing holder in which the above described problems are eliminated.

Another and more specific object of the present invention is to provide a part installing holder which facilitates parts exchange in the PC board and ensures a reduced cost of manufacturing the part installing holders.

Still another object of the present invention is to provide a part installing holder for installing a part on a printed circuit board, the part installing holder having two mutually opposed front and rear sides, the rear side facing to the printed circuit board and the front side facing to a direction opposite to the rear side, the part having at least two first terminals, the printed circuit board having a connecting section and at least two second terminals, the connecting section serving to mechanically connect the part installing holder to the printed circuit board, and the second terminals being provided on the printed circuit board and being electrically connected to the first terminals of the part, the part installing holder comprising a fitting portion into which the part is inserted, the fitting portion serving to locate the first terminals of the part on the second terminals of the printed circuit board, a fixing portion extending from the front side of the part installing holder to the rear side thereof, the fixing portion being mechanically connected to the printed circuit board, and a pressure portion extending rearward from the fitting portion to the rear side of the part installing holder, the pressure portion serving to bring the first terminals of the part on the second terminals of the printed circuit board under pressure due to an elastic deformation of the pressure portion when the part is inserted into the fitting portion, allowing electrical connection of the part to the printed circuit board. According to the present invention, it is possible for the terminals of the part to be electrically connected to the terminals of the PC board by the pressure due to an elastic deformation of the pressure portion without the need to solder the part to the printed circuit board. Also, according to the present invention, it is possible to detachably mount the part on the printed circuit board with ease, which ensures a reduction in the time and labor required for parts exchange. Further, the part installing holder according to the present invention can be formed through die molding of a resin material into one piece, which ensures a reduced cost of manufacturing products when compared to a case where the socket or the like is used.

Other objects and further features of the present invention will be apparent from the following detailed description when read in conjunction with the accompanying drawings.

BRIEF DESCRIPTION OF THE DRAWINGS

FIGS. 2A and 2B are a perspective rear view and a front view of the part installing holder shown in FIG. 1, respectively;

DESCRIPTION OF THE PREFERRED EMBODIMENTS

Figure 1:
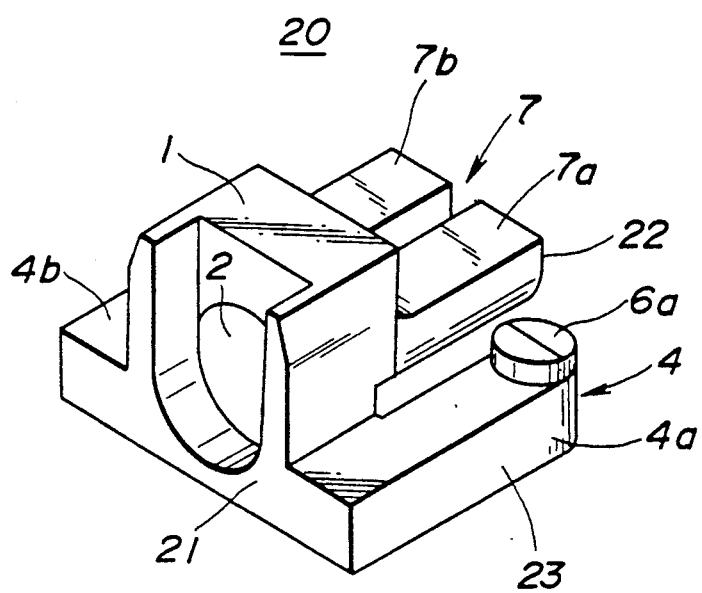
FIG. 1 is a perspective front view of an embodiment of a part installing holder according to the present invention.

Referring first to FIGS. 1, 2A and 2B, a description will be given of a first embodiment of a part installing holder according to the present invention. In this embodiment, the part to be installed on and removed from the printer circuit board is, for example, a light emitting diode (LED), but the present invention is applicable to other electronic devices as well.

In FIGS. 1, 2A and 2B, there is provided a part installing holder 20 according to the present invention, the part installing holder 20 generally having a front side 21, a rear side 22, a left side 23 and a right side 24. The part installing holder 20 includes a fitting portion 1 which has a cylindrical opening 2 with a diameter that allows the part such as the LED to be inserted into the cylindrical opening 2. A lower half of the cylindrical opening 2 is hollow across the length of the fitting portion 1, while an upper half of the cylindrical opening 2 has an end wall 2a at a rear end thereof. A pressure portion 7 extending rearward from the end wall 2a of the fitting portion 1 is formed into two flexible arms 7a and 7b. The flexible arms 7a and 7b are made from a flexible material. On bottom sides of the flexible arms 7a and 7b respectively, grooves 3a and 3b are provided so as to have a pitch distance therebetween generally equal to that between two terminals of the LED, as shown in FIGS. 2A and 2B. The grooves 3a and 3b serve to guide the terminals of the LED along the flexible arms 7a and 7b. The grooves 3a and 3b are formed on the bottom sides of the flexible arms 7a and 7b so that they extend slantwise downward along the pressure portion 7 to place the rear ends of the LED terminals below a top surface of a printed circuit board (PC board) 5. A fixing portion 4 is provided with two legs 4a and 4b respectively extending from lower areas of the fitting portion 1 on left and right sides of the part installing holder 20. At rear end positions of the legs 4a and 4b, bosses 6a and 6b are provided to allow the bosses 6a and 6b to be connected to holes 9a and 9b of the PC board 5, respectively.

The fitting portion 1, the fixing portion 4 and the pressure portion 7 are preferably formed into one piece through die molding of a resin material.

Meanwhile, the PC board 5 as shown in FIG. 2A has a connecting portion 5a where the fitting portion 1 of the part installing holder 20 is fitted. The connecting portion 5a in this embodiment is formed by cutting away one edge of the PC board 5 into a generally rectangular shape. On the top surface of the PC board 5, conduction terminals 8a and 8b made through pattern forming are provided at places corresponding to the flexible arms 7a and 7b of the part installing holder 20. The PC board 5 is also provided with holes 9a and 9b at places which correspond to the bosses 6a and 6b of the part installing holder 20, respectively.

In this embodiment, the connecting portion 5a is cut away from the PC board 5 into a generally rectangular shape. Obviously, it is possible to form the connecting portion 5a into a projecting section from one edge of the PC board 5 or a flat section in line with the edge of the PC board 5. Further, it is possible for the conduction terminals 8a, 8b and the holes 9a, 9b to be provided at places of the projecting connecting portion 5a of the printed circuit board 20 in a similar manner.

Figure 3:
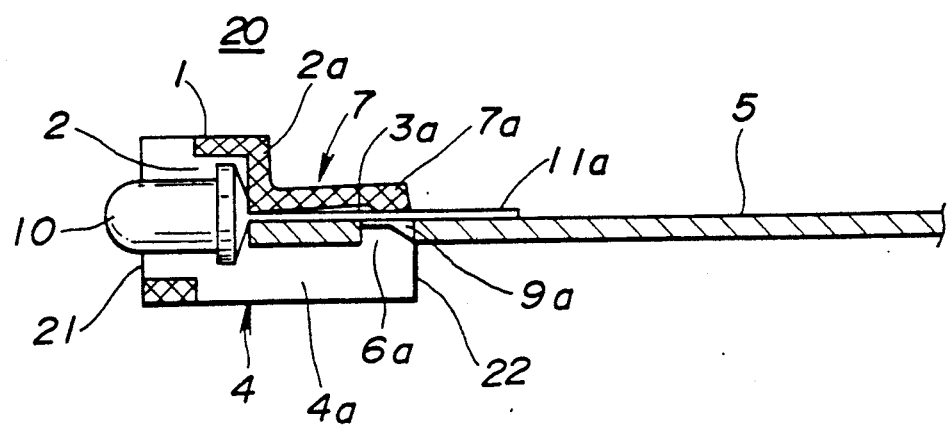
FIG. 3 is a sectional view of the part installing holder fitted to the printed circuit board, which is generally taken along a line A—A in FIG. 2A.

Next, a description will be given of a function of the part installing holder 20 according to the present invention. FIG. 3 is a sectional view of the LED installed holder 20 fitted on the PC board, which is generally taken along the line A—A in FIG. 2A. In FIG. 3, the LED 10 is inserted into the cylindrical opening 2 of the fitting portion 1, and a bottom of the LED 10 comes into contact with the end wall 2a of the holder 20. In this condition, the terminals 11a and 11b (terminal 11b not shown) of the LED 10 are guided from the end wall 2a into the grooves 3a and 3b on the bottom sides of the flexible arms 7a and 7b of the holder 20. The part installing holder 20 with the LED 10 fitted thereon is installed on the PC board by holding the LED 10 between the fixing portion 4 and the pressure portion 7 and fitting the bosses 6a and 6b into the holes 9a and 9b of the PC board 5, respectively. In this state, the terminals 11a and 11b of the LED 10 respectively are brought into contact with the conduction terminals 8a and 8b of the PC board 5 while the pressure portions 7a and 7b which are bending with the inserted LED 10 put an elastic force on the LED terminals 11a and 11b to ensure an electrical connection between the LED terminals and the PC board terminals. In a case where the LED 10 is to be exchanged, the part installing holder 20 according to the present invention provides a useful parts exchange function. One method of parts exchange is to extract only the LED 10 from the holder 20 which is fitted on the PC board 5, and to insert a new one into the holder 20. Another method is to remove the part installing holder 20 from the PC board 5, with the LED 10 to be exchanged remaining on the part installing holder 20. In such a case, the bosses 6a and 6b of the holder 20 are drawn out from the holes 9a and 9b of the PC board 5.

Figure 4:
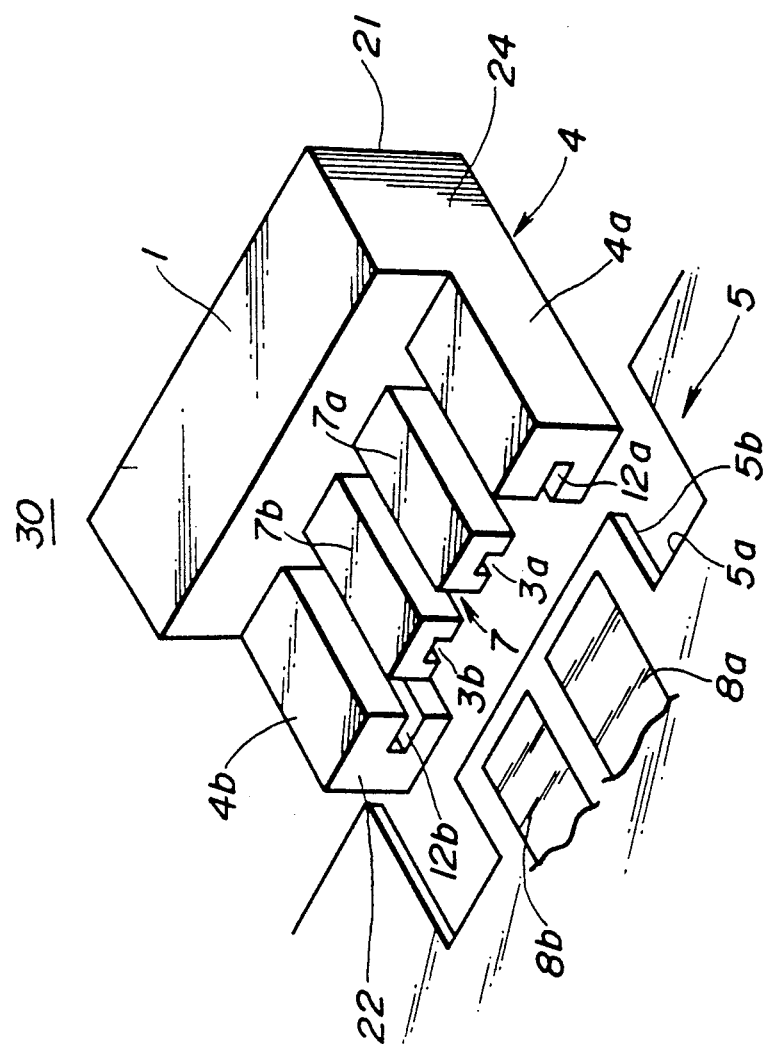
FIG. 4 is a perspective rear view of another embodiment of a part installing holder having a modified fixing portion according to the present invention.

Referring next to FIG. 4, a description will be given of a structure of another embodiment of a part installing holder according to the present invention. A part installing holder 30 generally has a front side 21, a rear side 22, a left side 23 and a right side 24. The part installing holder 30 includes a modified fixing portion 4. As shown in FIG. 4, the fixing portion 4 is provided with legs 4a and 4b which have guide grooves 12a and 12b formed on inner surfaces of the legs 4a and 4b, respectively. And, the PC board 5 is provided with a projecting portion 5b of a generally rectangular shape, within a recessed connecting portion 5a, where the conduction terminals 8a and 8b provided on the surface of the PC board 5. The projecting portion 5b so that the part installing holder 30 is installed on the PC board 5. Other configuration and functions of the part installing holder 30 shown in FIG. 4 than the above described fixing portion 4 are the same as those shown in FIGS. 1 through 3.

As described in the foregoing, the terminals of the part and the conduction terminals of the PC board are electrically connected together by the pressure due to an elastic deformation of the pressure portion. Therefore, there is no need to solder the part to the PC board, and the part like the LED is detachably mounted on the PC board with ease, ensuring a reduction in the time and labor required for parts exchange. In addition, the part installing holder according to the present invention is formed through die molding of a resin material into one piece, ensuring a reduced cost of manufacturing products when compared to the case of the socket or the like.

Further the present invention is not limited to these embodiments but various variations and modifications may be made without departing from the scope of the present invention.

What is claimed is:

1. A holder for installing a part on a printed circuit board, said holder having two mutually opposed front and rear sides, said rear side facing to the printed circuit board and said front side facing to a direction opposite to said rear side, said part having at least two first terminals, said printed circuit board having a connecting section and at least two second terminals, said connecting section serving to mechanically connect the holder to the printed circuit board, and said second terminals being provided on the printed circuit board and being electrically connected to the first terminals of the part, said holder comprising:

a fitting portion into which the part is inserted, said fitting portion serving to locate the first terminals of the part on the second terminals of the printed circuit board;

a fixing portion extending from the front side of the holder to the rear side thereof, said fixing portion being mechanically connected to the printed circuit board; and a pressure portion extending rearward from the fitting portion to the rear side of the holder, said pressure portion serving to bring the first terminals of the part on the second terminals of the printed circuit board under pressure due to an elastic deformation of said pressure portion when the part is inserted into the fitting portion, allowing electrical connection of the part to the printed circuit board.

2. A holder as claimed in claim 1, wherein said holder is formed into one piece through die molding of a resin material, so that the pressure portion is subjected to elastic deformation when the part is inserted into the fitting portion.

3. A holder as claimed in claim 1, wherein said fitting portion comprises an opening having a generally cylindrical shape that allows the part to be inserted into said fitting portion.

4. A holder as claimed in claim 1, wherein said fixing portion comprises at least two legs each extending from the front side to the rear side of the holder and at least two bosses at rear end positions of said legs, said bosses being connected to at least two openings of the printed circuit board.

5. A holder as claimed in claim 4, wherein said pressure portion comprises at least two flexible arms each extending from the fitting portion to the rear side of the holder, each of said flexible arms having a guide groove on a bottom surface of each of the flexible arms, so that the first terminals of the part are guided in said guide grooves and come into contact with the second terminals of the printed circuit board.

6. A holder as claimed in claim 1, wherein said connecting section of the printed circuit board is formed into a recessed connecting section having a generally rectangular shape that corresponds to a horizontal cross-section of the fitting portion of the holder.

7. A holder as claimed in claim 1, wherein said connecting section of the printed circuit board is formed into a projecting connecting section having first and second side edges.

8. A holder as claimed in claim 7, wherein said fitting portion comprises an opening having a generally cylindrical shape that allows the part to be inserted into said fitting portion, said fixing portion comprising at least two legs each extending from the front side to the rear side of the holder and at least two inside grooves each being formed on an inside area of each of said legs so that the first and second side edges of the projecting connecting section are fitted in said inside grooves, and said pressure portion comprising at least two flexible arms each extending from the fitting portion to the rear side of the holder, each of said flexible arms having a guide groove on a bottom surface of each of the flexible arms so that the first terminals of the part are guided in said guide grooves and come into contact with the second terminals of the printed circuit board.

* * * * *